United States Patent

Vilkomerson

[11] 3,978,508
[45] Aug. 31, 1976

[54] PRESSURE SENSITIVE FIELD EFFECT DEVICE

[75] Inventor: David Herman Raphael Vilkomerson, Princeton, N.J.

[73] Assignee: RCA Corporation, New York, N.Y.

[22] Filed: Mar. 14, 1975

[21] Appl. No.: 558,469

[52] U.S. Cl. .................................. 357/26; 357/23; 357/41
[51] Int. Cl.² .................. H01L 29/78; H01L 27/20; H01L 29/84
[58] Field of Search .............................. 357/23, 26

[56] References Cited
UNITED STATES PATENTS

| | | | |
|---|---|---|---|
| 3,287,506 | 11/1966 | Haehnlein | 357/26 |
| 3,305,737 | 2/1967 | Young | 357/26 |
| 3,436,492 | 4/1969 | Reedyk | 357/26 |
| 3,440,873 | 4/1969 | Eichelberger | 357/26 |
| 3,875,433 | 4/1975 | Uchikawa | 357/26 |

OTHER PUBLICATIONS

Sessler et al., Applied Physics Letters, vol. 17, No. 12, pp. 507–509, Dec. 1970.

*Primary Examiner*—William D. Larkins
*Attorney, Agent, or Firm*—H. Christoffersen; R. P. Williams; R. A. Hays

[57] ABSTRACT

A pressure sensitive field effect semiconductor device, which may be employed as a contactless switch is disclosed. The device employs at least one layer of an elastomer material which is also an electret to effectuate the conversion of a longitudinal pressure variation to an electrical variation and to create an electric field which regulates the conductivity of the current carrying channel.

7 Claims, 7 Drawing Figures

PRESSURE SENSITIVE FIELD EFFECT DEVICE

The present invention generally relates to mechanical-electrical transducers and particularly relates to pressure sensitive switches.

Known pressure sensitive switches employ piezoelectric ceramics, such as lead zirconate, to effectuate the conversion of pressure into an electrical signal. These materials are quite sensitive and are fairly easy to obtain.

However, for making keyboard switches, for example, it is often desirable to include logic or amplification functions within the switch. This is difficult to do with conventional elements such as piezoelectric elements since means for performing these functions must be attached to the piezoelectric ceramic. This generally involves fabricating the switch portion and the logic or amplification means separately and then connecting the two portions together.

Figure 4:
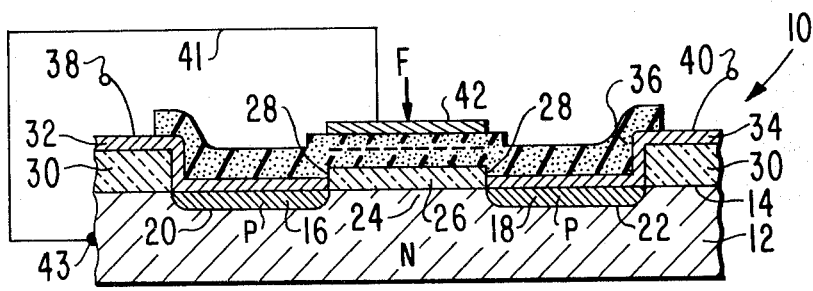
FIG. 4 is a partial cross-sectional view of one embodiment of the present device, not drawn to scale.

The present device, one embodiment of which is indicated generally at 10 in the drawings, will best be understood structurally with reference to FIG. 4. The device 10 comprises a body 12 of semiconductor material having one type conductivity, N type for example, and having a surface 14. It will be understood that the conductivity type of the body 12 may be P type so long as all other conductivity types of the various regions of the device to be described hereinafter are correspondingly reversed.

Within the body 12 of semiconductor material and adjacent the surface 14 thereof, there is a first region 16 and a second region 18 both having a second conductivity, P type in this example. A first PN junction 20 exists at the interface between the first region 16 and the body 12; and a second PN junction 22 exists at the interface between the second region 18 and the body 12.

The first region 16 and the second region 18 in the body 12 of semiconductor material are spaced apart therein by a channel region 24.

A relatively thin insulating layer 26, preferably silicon dioxide, overlies portions of the surface 14. The layer 26 has openings 28 which expose the first region 16 and the second region 18. A relatively thick insulating layer 30 overlies other portions of the surface 14.

A first electrode 32 overlies and electrically contacts the first region 16 through one of the openings 28. A second electrode 34 overlies and electrically contacts the second region 18 through another of the openings 28.

A resilient compressible, electric field producing means 36 is disposed on the relatively thin insulating layer 26, in continuous contact therewith, over the channel region 24. Preferably, the resilient, compressible, electric field producing means 36 is an elastomer, such as silicone rubber, which is also an electret. Almost any elastomer may be used for the resilient, compressible, electric field producing means 36, such as polysulfide rubbers, butadiene-styrene copolymers, polychloroprene butadiene-acrylonitrile copolymers, isobutylene diolefin copolymers or the like. An electret is a charged dielectric material having separate electric poles of opposite signs and may be either permanent or semipermanent. It may be thought of as an electrostatic counterpart of a permanent magnet. An electret, alternatively, may have an electric pole of one sign substantially imbedded therein with electric poles of opposite signs being induced at the surfaces thereof. This is generally referred to as a homopolar electret. It will be understood by those in the art that an electret differs from a ferroelectric material in that a ferroelectric material redistributes its electric field pattern upon the application of an electric field. This does not occur in the electric field pattern of an electret.

First and second terminal means 38 and 40 respectively, provide electric contact to the first electrode 32 and the second electrode 34, respectively. The terminal means 38 and 40 may be thin wires bonded or otherwise connected to the first electrode 32 and the second electrode 34; or they may be points of interconnection, by means of conductive paths, with other devices on the same body 12 of semiconductor material or other proximate devices. A counter electrode 42 overlies the channel region 24 and electrically contacts the resilient compressible, electric field producing means 36 and also is electrically connected to the body 12 of semiconductor material thereby forming a conductive path therebetween. The counter electrode 42 may be connected to the body 12 by extending it over an edge of the means 36 and through an aperture, not shown, in the layer 26 or 30 into contact with the body 12 or by external means, as shown in FIG. 4 wherein a conductive path 41, for example a wire, is connected between the conductive electrode 42 and the body 12 at the contact point 43.

The device 10 may be fabricated in the following manner. Starting with the body 12 of semiconductor material, preferably silicon, the first region 16 and the second region 18 are introduced adjacent the surface 14. Any method known in the semiconductor art may be used, such as doped oxide diffusion, ion implantation, or the like.

Figure 1:
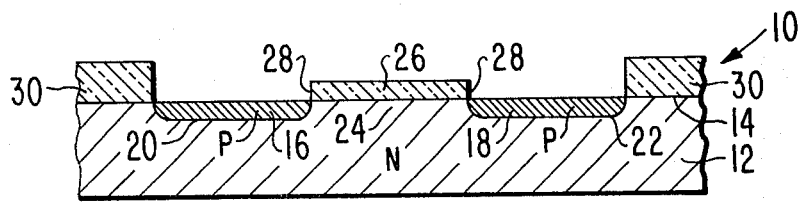
FIGS. 1 to 3 are partial cross-sectional views of sequential steps in the fabrication of the present device, not drawn to scale.

In this example, the relatively thick insulating layer 30 may be formed on the surface 14 by methods known in the art such as by oxidizing the body 12 in steam, for example. Using known photolithographic techniques, an opening, not labeled in the drawings, is formed in the layer 30 and the relatively thin insulating layer 26 is formed therein by methods known in the art. Using known etching and photolithographic techniques, the openings 28 are defined in the relatively thin insulating layer 26 and expose the first region 16 and the second region 18 therebelow, as shown in FIG. 1.

Figure 2:
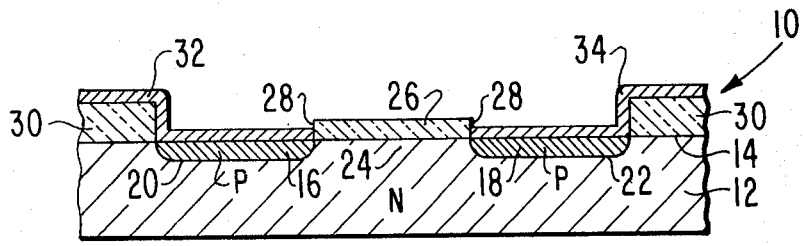

Using methods known in the semiconductor art, such as RF sputtering, chemical vapor deposition, or the like, the first and second electrodes 32 and 34, respectively, are then formed. The material of the electrodes may be gold, aluminum, or any other conductive material compatible with the particular method employed for the formation; for example, gold may be used in the RF sputtering method. Preferably, the first and second electrodes, 32 and 34 respectively, are formed so that they extend over portions of the relatively thick insulating layer 30. The resulting structure is diagrammatically shown in FIG. 2.

The resilient, compressible, electric field producing means 36 is then disposed on the relatively thin insulating layer 26, in continuous contact therewith, over at least the channel region 24, by dip-coating, for example. The resilient, compressible, electric field producing means 36 may be, for example, an elastomer such as RTV 602 which is a silicone rubber made and marketed by the General Electric Company. One way to make the elastomer is to add about 1.5 grams of SRC 05, a catalyst marketed by the General Electric Company, to about 19.5 grams of RTV 602, dissolved in about 100 milliliters of cyclohexane. The device 10 is then dipped into this solution and then removed therefrom, with some of the solution wetting the device.

Figure 3:
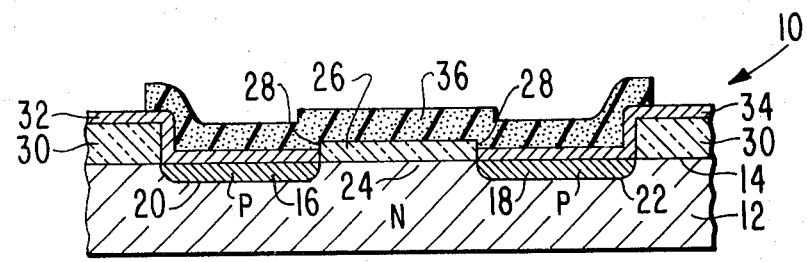

Preferably, the thickness of the layer of elastomer is between from about 0.5 $\mu$m to 10 $\mu$m, for example about 1 $\mu$m. In the dip coating process, the slower the device 10 is removed from the solution, the thinner the layer of elastomer will be. For a layer of approximately 1 $\mu$m thickness, the device 10 is preferably removed at the rate of approximately 4 linear inches per minute from a solution which has the viscosity of about that of castor oil. The device 10 is preferably removed at the above rate in a manner such that the direction of removal is substantially perpendicular to the surface 14 to be coated. The elastomer is then cured, for example, by heating it to about 60° C. for about one hour. The layer of elastomer is defined using masking and photolithographic techniques. For example, a layer of photoresist, not shown in the drawings, may be used as a mask, and cyclohexane may be used as a solvent. The device 10, coated and defined in this manner, is shown in FIG. 3.

The elastomer may then be formed into an electret or the electret formation may be performed after the fabrication of the counter electrode 42 to be described below. Electron bombardment is preferred for this purpose, but ion implantation, corona or Townsend discharge methods or the like may also be used. For a homopolar electret, which is preferred, the bombardment results in the trapping of negative charges in the elastomer at some distance from the side of the elastomer facing the oncoming electron beam. These negative charges attract positive charges in the relatively thin insulating layer 30 and in the counter electrode 42. Those skilled in the art will recognize that although reference is make to the positive charges in the relatively thin insulating layer 30 in fact the reference is to the polarization of the electric dipoles within the material. A discussion of the intricacies of electret formation may be found in an article by G. M. Sessler and J. E. West, entitled, CHARGING OF POLYMER FOILS WITH MONOENERGETIC LOW-ENERGY ELECTRON BEAMS; published in APPLIED PHYSICS LETTERS, Dec. 1970, Vol. 17, No. 12, pages 507–509. It is desirable to use a masking layer, for example, of silicon dioxide, silicon nitride, or the like, not shown in the drawings, to define the area of the layer of elastomer wherein an electret is to be formed, for example, over the channel region 24. The masking layer may be formed by known methods.

The first and second terminal means and the counter electrode 38, 40, and 42 respectively may be formed by employing techniques known in the semiconductor art.

The preferred operation of the device 10 is similar to the conventional operation of an insulated gate field effect transistor (IGFET). In this mode of operation the first region 16 may act as a source region, the second region 18 may act as a drain region and the resilient, compressible electric field producing means 36 may act as a gate.

Figure 5:
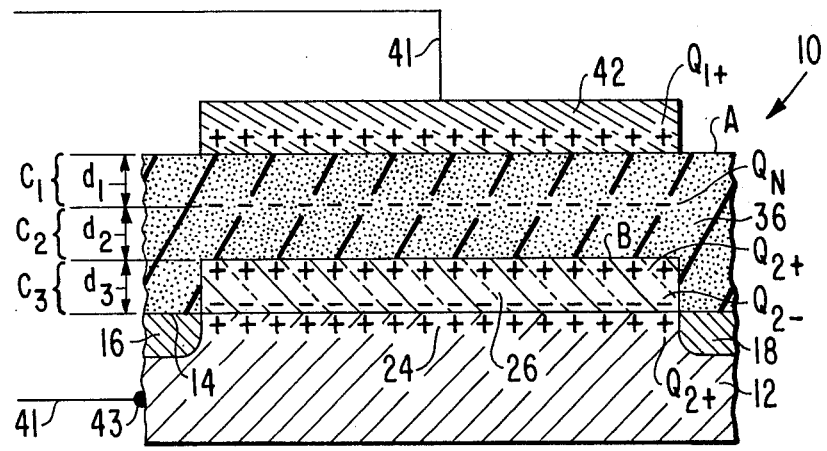
FIG. 5 is a diagramatic representation of a typical charge distribution of the present device.
Figure 6:
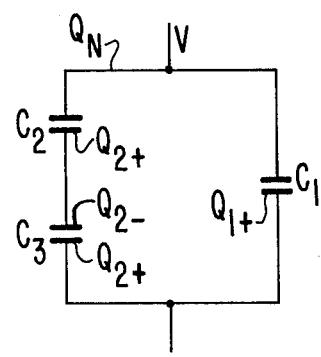
FIG. 6 is a schematic diagram of the capacitive relationships in the present device.

The operation, as it is presently understood, of the device 10 may be explained with reference to FIGS. 5 and 6. FIG. 5 diagrammatically shows the charge distribution when the device 10 is in an uncompressed state, for example. FIG. 6 is a schematic diagram which effectively represents the capacitive relationship in the device 10. In this example, the homopolar electret has an electrostatic potential which is represented by V; this potential is a result of a quantity of charge $Q_n$ having been introduced into the resilient, compressible, electric field producing means 36. As shown, a first layer of positive charges $Q_{1+}$ is induced at the interface between the counter electrode 42 and a surface A of the means 36. A second layer of positive charges $Q_{2+}$ is induced in the relatively thin insulating layer 26 at the interface between the relatively thin insulating layer 26 and a surface B of the means 36. These positive charges will not pass into the means 36 since it is an insulator and so they are analogous to plate charges on a parallel plate capacitor. The sum of the positive charges induced, $Q_{1+} + Q_{2+}$, will be equal to the negative charge $Q_n$. The first layer of positive charges in the counter electrode 42, i.e. $Q_{1+}$, and the corresponding portion of the negative charges, $Q_n$, may be schematically represented by a capacitor $C_1$ having a plate separation of $d_1$ and a dielectric constant of $\epsilon_1$. Likewise the positive charges in the layer 26 and the remainder of the negative charges of $Q_n$ may be schematically represented by a capacitor $C_2$ having a plate separation of $d_2$ and a dielectric constant of $\epsilon_2$. As shown in FIG. 6 the polarized relatively thin insulating layer may be represented by a capacitor $C_3$ having an effective plate separation of $d_3$ and a dielectric constant of $\epsilon_3$.

In this case the positive charges induced in the layer 26, i.e. $Q_{2+}$ will induce an equal number of negative charges $Q_{2-}$ at the channel side of the layer 26. These negative charges will repel electrons from the channel region 24 and attract holes therein thus creating a current carrying channel. It should be noted that the counter electrode 42 creates a completed circuit path for the equalization of charge potentials, i.e. it induces a concentration of negative charges in the body 12 which is equal to the quantity of positive charges $Q_{1+}$. It is now apparent that the conductivity of the channel region 24 is dependent upon the quantity of positive charges $Q_{2+}$ induced by the homopolar electret. It can be shown that the quantity of positive charges $Q_{2+}$ in the channel region 24 is proportional to the ratio of $d_1/d_2 + d_3$. Upon compression of the means 36, for example, by a force applied in the direction of the arrow F in FIG. 4, the ratio of $d_1/d_2 + d_3$ changes since $d_3$ is essentially a constant. Hence the conductivity of the channel region 24 will be changed. It will be understood that the distances $d_1$ and $d_2$ may be adjusted such that a non-negligible current will flow from the source region 16 to the drain region 18 when the means 36 is in a compressed state. The resilient, compressible, electric field producing means 36 thereby provides pressure responsive means for controlling the conductivity of the channel region 24. It will be noted that the device 10 may be operated in either the enhancement mode or the depletion mode.

Although the operation of device 10 has been described as utilizing a homopolar electret, which is preferred, the device 10 may also be operated using a bipolar electret. In that case the conductivity of the channel region 24 is controlled by the charge layer closest thereto.

It has been determined that a pressure resulting from as slight as a few grams of force may be used to operate the device 10. This slight pressure requirement may be undesirable in a manually controlled device since the device could be easily operated by mistake.

Figure 7:
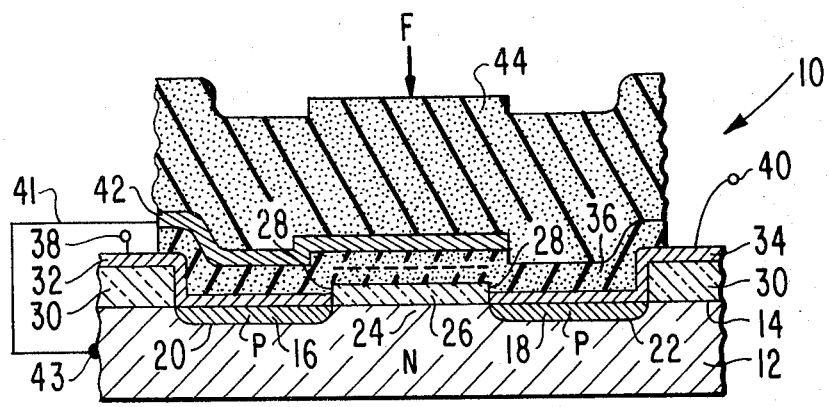
FIG. 7 is a partial cross-sectional view of a modification of the present device, not drawn to scale.

A feature incorporated with the present device 10, which makes it less sensitive to low pressures is shown in FIG. 7. This feature is a resilient compressible means 44 disposed on the resilient, compressible, electric field producing means 36. In order to increase the pressure necessary to operate the device 10, the resilient, compressible means 44 may either have a lower value of Young's modulus or be of the same Young's modulus but be relatively thicker than the resilient, compressible, electric field producing means 36. Young's modulus as is known is a measure of the compressibility of a material, i.e., the lower the Young's modulus of a material the easier it is to compress that material. In this case, the resilient, compressible, electric field producing means 36, would transmit only a fraction of the total applied pressure to the resilient, compressible, electric field producing means 36. In order to provide a resilient, compressible means 44 with a relatively lower Young's modulus a different elastomer than employed in the fabrication of the means 36 may be used or impurities may be added to the same type of elastomer to reduce its Young's modulus.

Preferably, however, the resilient, compressible means 44 is of the same material as that of means 36, but relatively thick in comparison therewith. A basic law of physics teaches that a compression force or pressure applied to a material is reduced proportionately through the thickness of the material. Hence if the Young's modulus for the resilient, compressible means 44 is the same as that of the means 36 the relative thicknesses will determine the force or pressure necessary to operate the device 44. For example, if the means 36 is about 1 μm thick and a force of about one gram is necessary to operate the device 10, a device 10 with a resilient compressible means 44 of about 10 μm in thickness will require about 10 grams of force to create one gram of force on the means 36 in order to operate this device.

This resilient compressible means 44 may be formed by a dip coating procedure similar to that used in the formation of the means 36. The only variable, which is dependent on the thickness desired, is the rate of removal from the solution of elastomer.

The present device 10 may be utilized as a switching element for a keyboard array. One advantage of such use is that conversion from the applied force or pressure to a code corresponding to a particular key, by fabricating coding logic on the body 12 of semiconductor material in addition to the device 10, is easily accomplished using conventional techniques of the semiconductor art. Also, there are no mechanical parts or contacts to wear out.

The present device 10 is compatible with, and may be fabricated using, other known semiconductor integrated circuit techniques such as, for example, silicon-on-sapphire. The choice of technique may depend upon the requirements of surrounding devices in the integrated circuit. For example, if relatively high speed devices are to be incorporated with the present devices 10 aand 44, then silicon-on-sapphire or like techniques may be preferable.

What is claimed is:

1. A pressure sensitive field effect device which is a part of a semiconductor integrated circuit which comprises:
    a first region and a second region in a body of semiconductor material, adjacent to a surface of said body and separated therein by a channel region, said channel region having a relatively thin insulating layer disposed thereover;
    resilient, compressible, electric field producing means disposed on said relatively thin insulating layer in continuous contact therewith, over said channel region, said resilient, compressible, electric field producing means being an elastomer which is also an electret;
    a counter electrode disposed over said channel region; and
    means providing a conductive path from said counter electrode to said body.

2. A pressure sensitive field effect device as claimed in claim 1 wherein:
    said insulating layer is silicon dioxide.

3. A pressure sensitive field effect device as claimed in claim 1 wherein:
    said electret is a homopolar electret.

4. A pressure sensitive field effect device as claimed in claim 1 wherein:
    said elastomer is a silicone rubber.

5. A pressure sensitive field effect device as claimed in claim 1 further comprising:
    a resilient compressible means disposed on said resilient compressible electric field producing means.

6. A pressure sensitive field effect device as claimed in claim 5 wherein:
    said resilient, compressible means is a layer of an elastomer.

7. A pressure sensitive field effect device as claimed in claim 5 wherein:
    said resilient compressible means is relatively thicker than said resilient, compressible electric field producing means.

* * * * *